United States Patent [19]

Sato

[11] Patent Number: 4,800,441
[45] Date of Patent: Jan. 24, 1989

[54] BINARY DATA COMPRESSION AND EXPANSION PROCESSING APPARATUS

[75] Inventor: Fumitaka Sato, Tokyo, Japan

[73] Assignee: Kabushiki Kaisha Toshiba, Kawasaki, Japan

[21] Appl. No.: 18,334

[22] Filed: Feb. 24, 1987

[30] Foreign Application Priority Data

Feb. 28, 1986 [JP] Japan .................................. 61-43693

[51] Int. Cl.$^4$ .......................................... H04N 1/419
[52] U.S. Cl. .................. 358/261.1; 358/260; 375/27
[58] Field of Search .................... 358/261, 260; 375/27

[56] References Cited

U.S. PATENT DOCUMENTS

| | | | |
|---|---|---|---|
| 4,562,484 | 12/1985 | Rallapalli et al. | 358/261 |
| 4,760,459 | 7/1988 | Sato | 358/260 |
| 4,760,461 | 7/1988 | Sato | 358/261 |

FOREIGN PATENT DOCUMENTS

| | | |
|---|---|---|
| 3137704 | 1/1986 | Fed. Rep. of Germany . |
| 3543081 | 3/1987 | Fed. Rep. of Germany . |
| 2146874 | 4/1985 | United Kingdom . |

OTHER PUBLICATIONS

The Hitachi Hyoron, vol. 67, No. 8, Aug. 1985, pp. 45–50 and p. 84; N. Hamada et al.

*Primary Examiner*—Howard W. Britton
*Attorney, Agent, or Firm*—Foley & Lardner, Schwartz, Jeffery, Schwaab, Mack, Blumenthal & Evans

[57] ABSTRACT

A binary data compression and exansion processing apparatus of this invention has an input data holding section for holding input code data. In an address section, bit data having a predetermined length is selected from code data held in the holding section in accordance with an instruction from an addition section, and address data for a decode section is generated from instruction data from a control section and the selected data. The decode section generates data associated with the run length in response to the generated address data, and outputs data indicating the length of the decoded code data portion. The addition section adds the data indicating the length to the previous instruction, and outputs sum data as the next instruction. When the sum data becomes equal to an input bit width, the control section outputs an instruction to the input data holding section so as to input the next code data. Therefore, the decoding processing apparatus of this invention can parallel-process input code data in a pipeline manner.

18 Claims, 10 Drawing Sheets

| | $2^{10}$ | $2^9$ | $2^8$ | $2^7$ | $2^6$ | $2^5$ | $2^4$ | $2^3$ | $2^2$ | $2^1$ | $2^0$ |
|---|---|---|---|---|---|---|---|---|---|---|---|
| REGION FOR DECODING | | | | | | | | | | | |
| WHITE RUN ONE-DIMENSIONAL CODE TABLE 1 | 0 | 0 | C8 | C7 | — | — | — | — | — | C1 | C0 |
| BLACK RUN ONE-DIMENSIONAL CODE TABLE 2 | 0 | 1 | C8 | — | — | — | — | — | — | — | C0 |
| BLACK RUN ONE-DIMENSIONAL CODE TABLE 1 | 1 | 0 | 0 | 0 | C6 | — | — | — | — | — | C0 |
| TWO-DIMENSIONAL CODE TABLE | 1 | 0 | 0 | 1 | C6 | — | — | — | — | — | C0 |
| SPECIAL CODE DETECTION TABLE | 1 | 0 | 1 | 1 | 0 | C5 | — | — | — | — | C0 |
| UNCOMPRESSED CODE TABLE 1 | 1 | 0 | 1 | 0 | 0 | C5 | — | — | — | — | C0 |
| UNCOMPRESSED CODE TABLE 2 | 1 | 0 | 1 | 0 | 1 | C5 | — | — | — | — | C0 |
| OTHER TABLE | 1 | 0 | 1 | 1 | 1 | 0 | 0 | 0 | 0 | C1 | C0 |
| REGION FOR ENCODING | | | | | | | | | | | |
| RUN LENGTH TABLE | 1 | 1 | C8 | — | — | — | — | — | — | — | C0 |

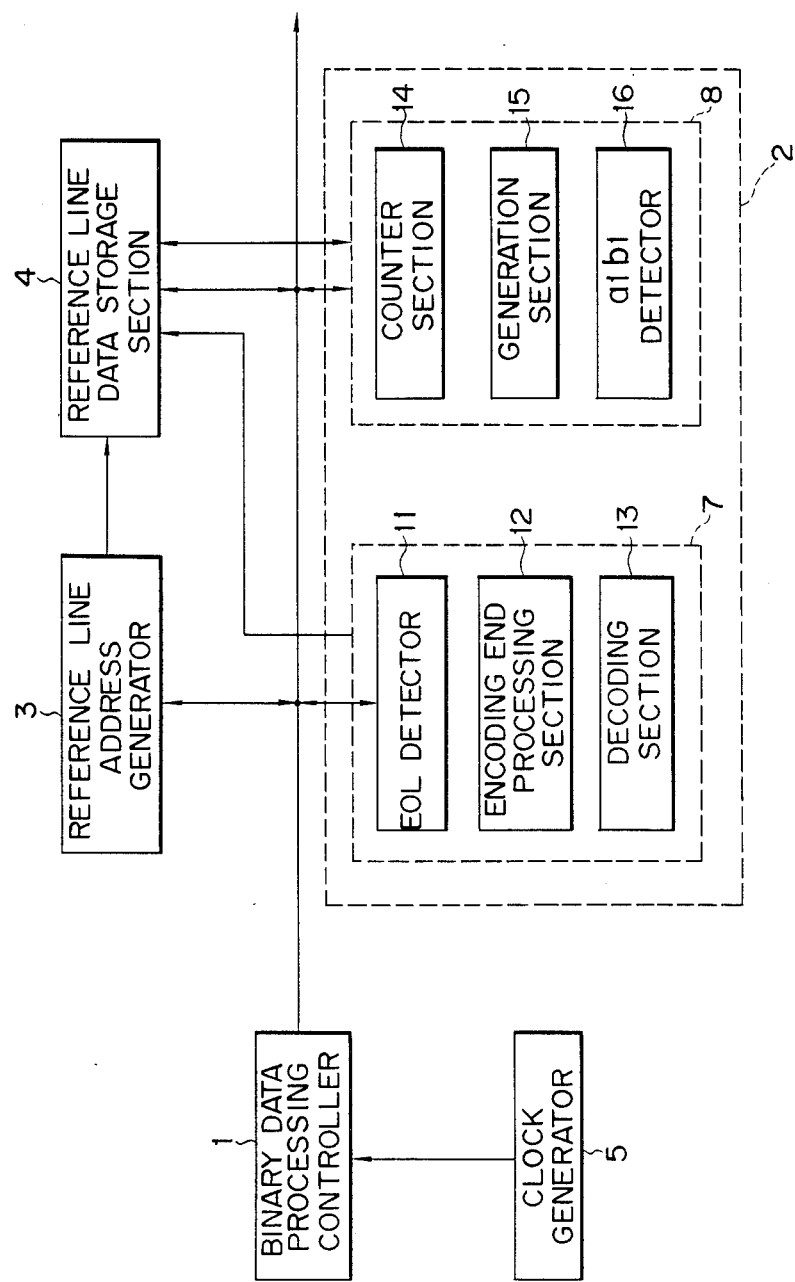
F I G. 1

F I G. 5
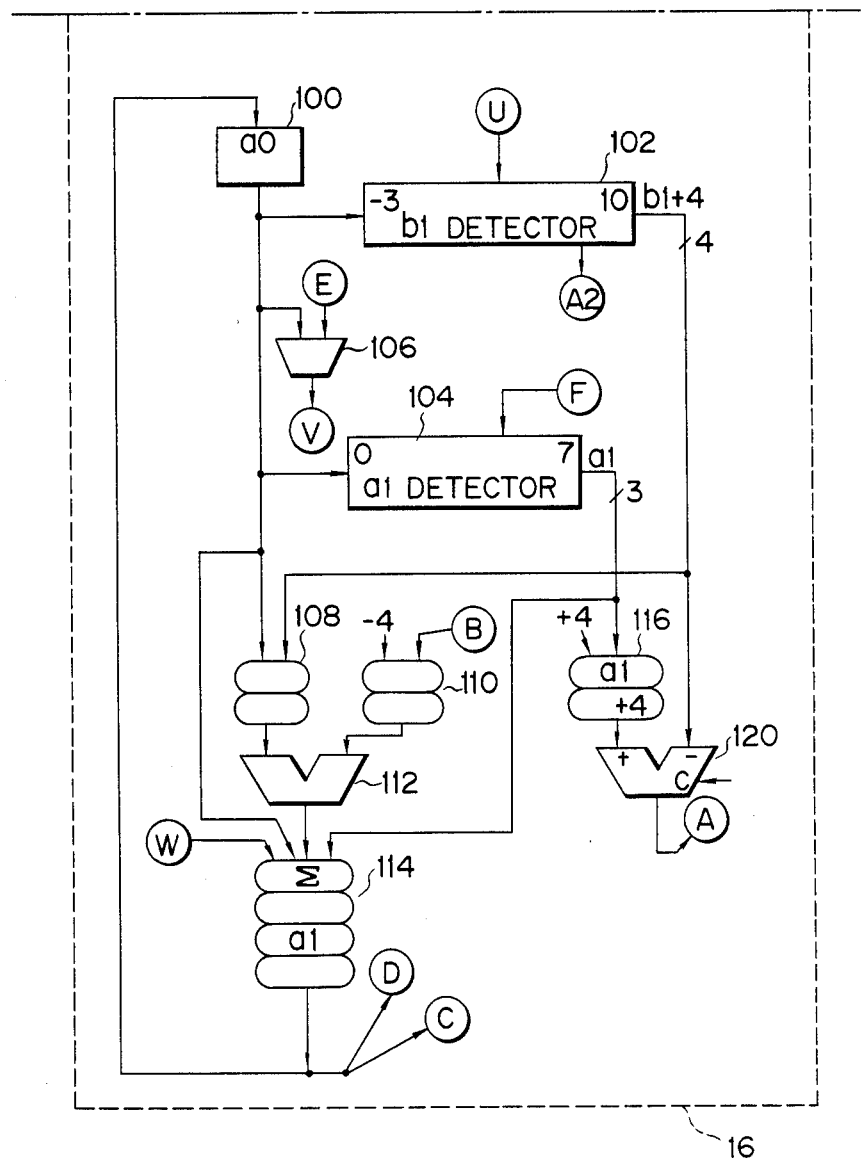

㉑ COUNT RUN LENGTH
㉒ ENCODING IN UNCOMPRESSED MODE
㉓ ENCODING IN UNCOMPRESSED MODE FOR END POINT
㉔ IDLE

FIG. 8

| REGION FOR DECODING | $2^{10}$ | $2^9$ | $2^8$ | $2^7$ | $2^6$ | $2^5$ | $2^4$ | $2^3$ | $2^2$ | $2^1$ | $2^0$ |
|---|---|---|---|---|---|---|---|---|---|---|---|
| WHITE RUN ONE-DIMENSIONAL CODE TABLE 1 | 0 | 0 | C8 | C7 | — | — | — | — | — | C1 | C0 |
| BLACK RUN ONE-DIMENSIONAL CODE TABLE 2 | 0 | 1 | C8 | — | — | — | — | — | — | — | C0 |
| BLACK RUN ONE-DIMENSIONAL CODE TABLE 1 | 1 | 0 | 0 | 0 | C6 | — | — | — | — | — | C0 |
| TWO-DIMENSIONAL CODE TABLE | 1 | 0 | 0 | 1 | C6 | — | — | — | — | — | C0 |
| SPECIAL CODE DETECTION TABLE | 1 | 0 | 1 | 1 | 0 | C5 | — | — | — | — | C0 |
| UNCOMPRESSED CODE TABLE 1 | 1 | 0 | 1 | 0 | 0 | C5 | — | — | — | — | C0 |
| UNCOMPRESSED CODE TABLE 2 | 1 | 0 | 1 | 0 | 1 | C5 | — | — | — | — | C0 |
| OTHER TABLE | 1 | 0 | 1 | 1 | 1 | 0 | 0 | 0 | 0 | C1 | C0 |
| REGION FOR ENCODING RUN LENGTH TABLE | 1 | 1 | C8 | — | — | — | — | — | — | — | C0 |

FIG. 9A

| $2^{15}$      $2^{12}$ | $2^{11}$      $2^{8}$ | $2^{7}$                        $2^{0}$ |
|---|---|---|
| NEXT STATE INFORMATION | CODE LENGTH | DATA |

FIG. 9B

| | $2^7$ | $2^6$ | $2^5$ | $2^4$ | $2^3$ | $2^2$ | $2^1$ | $2^0$ |
|---|---|---|---|---|---|---|---|---|
| MAKE-UP CODE | 0 | 0 | \multicolumn{6}{c}{RUN LENGTH (×64)-1} |
| TERMINATING CODE | 0 | 1 | RUN LENGTH (×1)-1 | | | | | |
| VERTICAL MODE | 1 | 1 | 0 | 0 | \multicolumn{4}{c}{$\delta$-4} |
| PASS MODE | 1 | 0 | 0 | 1 | 1 | 1 | 0 | 0 |
| UNCOMPRESSED MODE | 1 | 0 | 1 | 0 | 0 | \multicolumn{3}{c}{PATTERN LENGTH} |

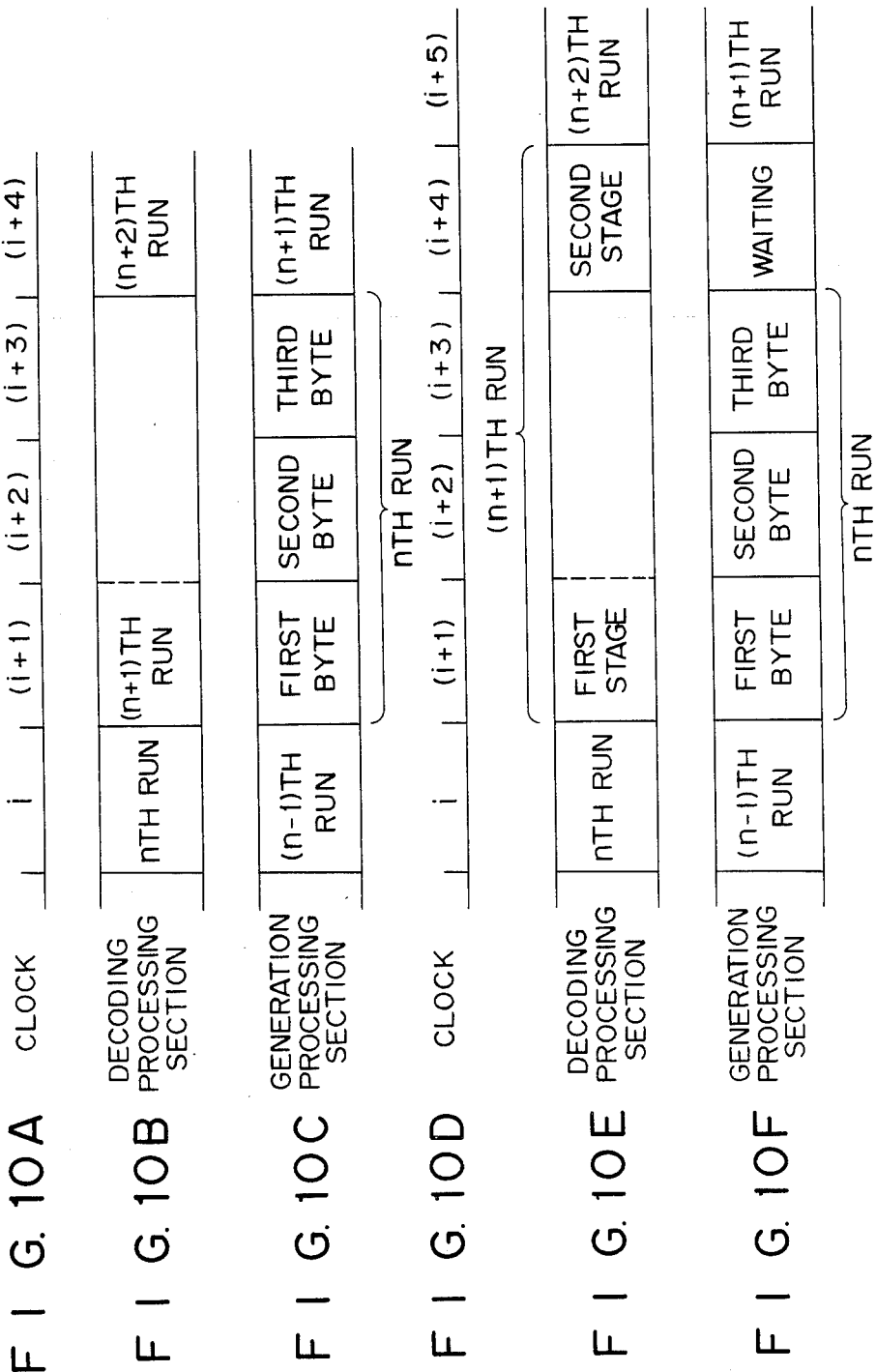

BINARY DATA COMPRESSION AND EXPANSION PROCESSING APPARATUS

BACKGROUND OF THE INVENTION

The present invention relates to a binary data compression and expansion processing apparatus which can expand binary data at high speed, and particularly, can parallel-decode, in a pipeline manner, binary data compressed by the M²R method.

As a method for compressing and expanding binary data, coding methods, such as the MH method, the MR method, and the M²R method, recommended by the CCITT, are internationally standardized, and are widely adopted. Among the three coding methods, i.e., the MH, MR, and M²R methods, the M²R method has the highest image compression efficiency.

The M²R method is well known as a coding method for Group IV facsimile systems. In this method, a. an End-Of-Line (EOL) code is omitted,
b. a k parameter is set to be infinite, and
c. all the bits of a reference line at the beginning of a page represent white pixels.

With these assumptions, a data compression ratio can be improved over that of the MR method. If a transmission error, if any, occurs, the error is sequentially transmitted to subsequent scanning lines as a principal problem. In order to prevent this, one-dimensional coding scanning lines are inserted in compression processing. The k parameter is the number of two-dimensional coding scanning lines between these one-dimensional coding scanning lines.

A conventional binary data compression and expansion processing apparatus has been realized in software, using a general-purpose microcomputer in order to perform expansion processing of encoded data according to these methods. In this processing, there is no problem when such an apparatus is applied to a facsimile system whose data transmission rate is limited to 9600 bps. However, when the conventional apparatus is used to display image data on work stations of a computer system, a good man-machine interface, for example, a page response time of ½ sec or less, cannot be achieved. Therefore, when the sequential expansion processing is executed in accordance with the M²R method, the operating speed is considerably reduced, when compared with the MH method.

One cause of the above problem lies in the processing method of the entire system. More specifically, in a conventional system, decoding is performed in a bit serial manner. In order to solve the problem, parallel processing, advanced processing, and pipeline processing are widely utilized. The binary image data expansion processing can be apparently divided into:

a. decoding processing of code
b. generation processing of image data for the decoded code Therefore, decoding and generation processing can be parallel-performed by separate hardware arrangements. In such arrangements, while a code is expanded, the next code is decoded, and the entire processing can be then pipelined. When binary data encoded by MH and MR methods is expanded, there is no problem in the advanced processing. However, the M²R method has the following problems.

In all the MH, MR, and M²R methods, the starting run of each line is always a white run and must be decoded to be white pixels. In the case of the MH and MR methods, an EOL code is used. Therefore, a decoding processing section which performs the advanced processing can detect the beginning of the next line due to the presence of an EOL code regardless of the progress of generation processing by a generation processing section.

However, since there is no EOL code in the M²R method, the beginning of the next line can only be detected when the generation processing section develops each code and reaches an end of line. Therefore, if the beginning of the next line is indeterminate, it cannot be determined if the color of this portion is forcibly determined as white.

As a result, a decoding operation of a horizontal mode using separate code tables for a white run and a black run cannot be started in an advanced manner. More specifically, in the expansion processing of the M²R method of a conventional apparatus, the advanced processing cannot be effectively performed.

As described above, the conventional apparatus has problems in a processing rate, a capability of general purpose use.

SUMMARY OF THE INVENTION

The present invention has been made in consideration of the above situation and has as its object to provide a binary data compression and expansion processing apparatus which can decode binary data at high speed, parallel-decode an input binary code data in a pipeline manner, particularly, in expansion processing of binary code data encoded by the M²R method, and detect an EOFB code (having a pattern corresponding to two subsequent EOL codes in the MH or MR method) at high speed, so as to enable advanced processing and to achieve high-speed expansion processing.

In order to achieve the above object, a binary data compression and expansion processing apparatus which can decode in a pipeline manner comprises:

holding means (26) for receiving the code data having a first predetermined length, and for holding the latest code data for a second predetermined length;

block output means (30, 31) for receiving the held code data in the holding means (26), for producing a code data block from input control data and a code data portion selected in accordance with bit position data input thereto, and for outputting the produced code data block in accordance with an output instruction;

decoding means (32) for generating data indicating a length of a code unit and run length data corresponding to the code unit beginning from a leading bit of the code data block in accordance with an input of the code data block; and bit position designation means (34, 36) for outputting the held bit position data to the block output means (30, 31), and for updating the bit position data in accordance with the code unit length data from the decoding means (32).

In order to achieve the above object, a binary data compression and expansion processing apparatus which can parallel-decode code data comprises:

addressing means (31) for generating address data from input control data and input code data, including a code unit as units of codes to be decoded;

decoding means (32), having a plurality of code tables for decoding code units, for outputting next state data indicating a table to be referred to decode the next code unit and run rength data of the decoded code unit; and control means (1) for outputting the control data to decode the current code unit in accordance with the next state data.

According to the present invention, the following effects can be obtained.

1. Upon decoding of an M²R code, since advanced processing is allowed together with parallel processing in a pipeline manner, processing, in particular, expansion processing can be performed at high speed. MH and MR codes can be subjected to the safe processing, so that its processing speed can be improved as compared to a conventional apparatus.

2. Although advanced processing is performed, redecoding processing when a line to be processed is updated can be easily performed.

3. A controller can immediately detect at the end of a line (two clocks later) that the decoding processing section detects ½ of an EOFB code even if special processing is not performed at the boundary of lines in order to discriminate the EOFB code.

4. Since a reference line buffer is provided, an image memory need not be used for reading out reference line image data, resulting in high-speed processing.

5. Since the reference line buffer is provided, a complex circuit for generating a reference line data address for the image memory can be omitted.

BRIEF DESCRIPTION OF THE DRAWINGS

FIG. 1 is a block diagram of a binary data compression and expansion processing apparatus according to an embodiment of the present invention;

FIG. 5 is a block diagram showing the arrangement of an a1b1 detector of the generation processing section shown in FIG. 1;

FIG. 8 is an address format of a decoder ROM shown in FIG. 2;

FIG. 9A is an output format of the decoder ROM shown in FIG. 2;

FIG. 9B is an output format of a run length data portion of the output format of the decoder ROM shown in FIG. 9A;

FIGS. 10A to 10F are timing charts showing the operation of the binary data compression and expansion processing apparatus according to the present invention;

DETAILED DESCRIPTION OF THE PREFERRED EMBODIMENTS

Figure 2:
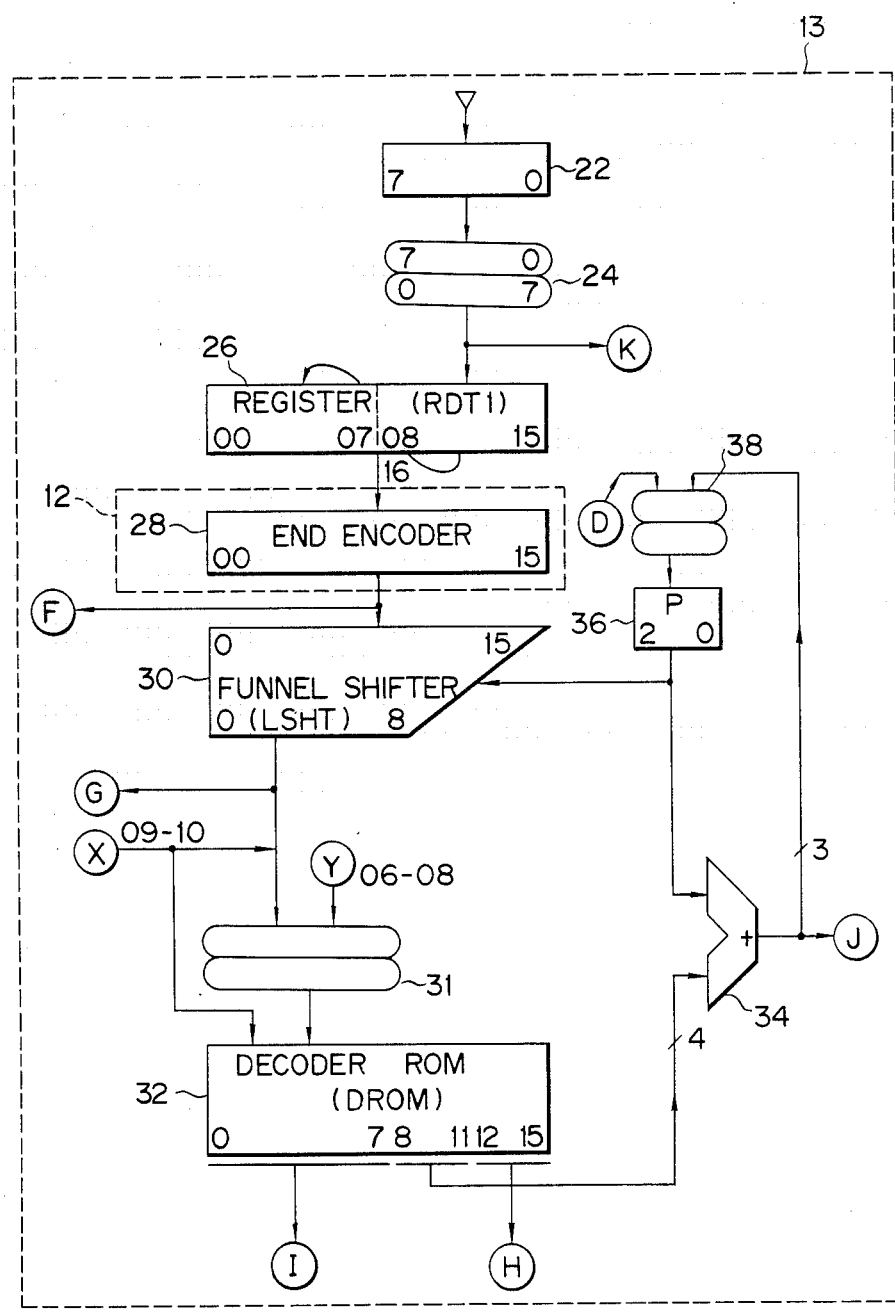
FIG. 2 is a block diagram showing the arrangement of a decoding section and an encoding end processing section of a decoding processing section shown in FIG. 1.

A binary data compression and expansion processing apparatus according to an embodiment of the present invention will now be described in detail with reference to the accompanying drawings.

The arrangement of the binary data compression and expansion processing apparatus according to an embodiment of the present invention will first be described with reference to FIG. 1.

The apparatus of this embodiment comprises binary data processing controller 1 for controlling the operation of the entire apparatus, compression and expansion processing section 2 for generating binary image pattern data when input binary data is a code and for generating a code when input binary data is image pattern data, reference line data storage section 4 for storing reference line data, reference line address generator 3 for generating address data for storage section 4, and clock generator 5 for generating control clocks.

Compression and expansion processing section 2 comprises decoding processing section 7 for generating run length data when input binary data is a code, and generation processing section 8 for generating binary image pattern data processed in accordance with the run length data.

Decoding processing section 7 comprises EOL detector 11 for checking if generation processing is completed to the end of a line and for detecting an EOL code under a given condition, encoding end processing section 12 used to generate an EOL code during compression processing, and decoding section 13.

Generation processing section 8 comprises counter section 14 for latching an output from decoding section 13 and for counting the number of processed bytes, generation section 15 for generating binary data processed based on data from counter section 14, and a1b1 detector 16 for detecting a1 and b1.

Controller 1 is connected to clock generator 5 for generating control clocks, and controls the operation timings of decoding processing section 7, generation processing section 8, and reference line address generator 3 based on the clocks from generator 5, and outputs necessary instructions upon progress of processing.

The arrangement of the respective sections will be described hereinafter in detail with reference to FIGS. 2 to 5. Note that a control signal is omitted from the drawings for the sake of simplicity.

First, decoding processing section 7 will be described in detail. FIG. 2 shows encoding end processing section 12 and decoding section 13 of decoding processing section 7. EOL detector 11 will be described later with reference to FIG. 4 together with reference line address generator 3.

Decoding section 13 is constituted by a circuit shown in FIG. 2, excluding encoding end processing section 12. One-byte data is input to and latched by latch 22 from an input data bus. Binary data latched by latch 22 is inverted by inverter 24, and is then input to register 26 and EOL detector 11 as data K. Register 26 shifts previously input byte data RDTI15-08 to be data RDTI07-00 in accordance with a control signal from controller 1, latches new input data as data RDTI15-08, and holds them as 16-bit data together with data RDTI07-00.

16-bit register data RDTI15-00 is output to funnel shifter 30 via encoding end processing section 12. Data RDTI07-00 is output to reference line data storage section 4 as byte data F. Decoding pointer 36 indicates an LSB (Least Significant Bit) position of a code to be decoded or a part of the code to be extracted next from register data RDTI15-00 input to funnel shifter 30. An indication value from decoding pointer 36 is supplied to funnel shifter 30 in accordance with a control signal from controller 1.

Funnel shifter 30 generates 9-bit output LSHT08-00 obtained by left-shifting data RDTI15-00 by the indication value from decoding pointer 36, and outputs it to selector 31. In the case of processing in the uncompressed mode, data LSHT04-00 of output data LSHT08-00 is output to generation processing section 8 as data G. Data LSHT08-00 is added to data X, corresponding to data LSHT10-09, from controller 1, and is output to selector 31 as 11-bit data. Selector 31 receives data Y, corresponding to data LSHT08-06 or LSHT08-07, from controller 1. These input data are selected in response to a control signal from controller 1, and are output to decoder ROM 32 as 11-bit address data. Also, data X is supplied to decoder ROM 32.

Decoder ROM 32 outputs 16-bit data DROM15-00. More specifically, as data DROM07-00, input binary data is output in the case of compression processing, and run length data is output in the case of expansion processing. Run length data I is sent to generation processing section 8. As data DROM11-08, a decoded data length of input data is output. As data DROM15-12, control data H for designating the next state is output. An address format and an output data format will be described later in detail.

Data DROM11-08 is output to adder 34. At the same time, adder 34 receives data of decoding pointer 36. Therefore, data DROM11-08 is added to the data from decoding pointer 36, and the summed data is output to selector 38. Selector 38 also receives data D, which is used in compression processing and is not used in expansion processing, from albl detector 16. Therefore, when expansion processing is performed in accordance with a control signal from controller 1, the summed data again becomes the content of decoding pointer 36. In this manner, pointer 36 indicates an LSB position of a code next to the decoded code.

If $2^3$-bit data becomes "1" data as a result of addition of adder 34, this is signaled to controller 1 by means of data J. This means that processing for one byte is completed. Controller 1 outputs a control signal to register 26 in accordance with data J from adder 34. Register 26 left-shifts data RDTI15-08 in units of bytes to be data RDTI07-00 in accordance with the control signal from controller 1. New byte data latched by latch 22 is latched in the data RDTI15-08 portion of register 26 in accordance with a control signal from controller 1. The lower 3 bits of the summed data of adder 34 are output to pointer 36, so that the LSB position of a code to be decoded is always present in data RDTI07-00 of register 26.

Figure 3:
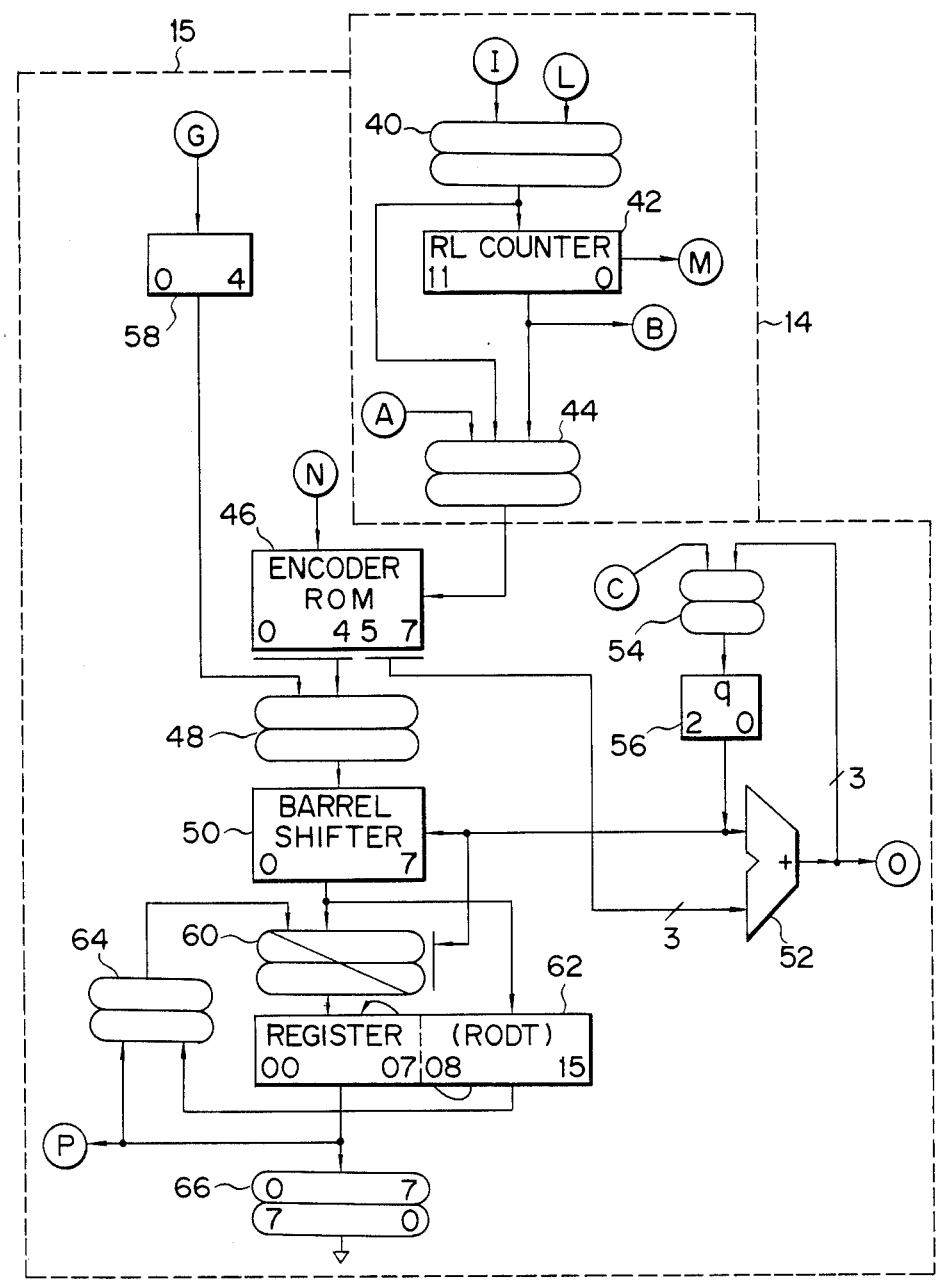
FIG. 3 is a block diagram showing the arrangement of a counter section and a generation section of a generation processing section shown in FIG. 1.

Counter section 14 and generation section 15 of generation processing section 3 will be described in detail with reference to FIG. 3. Counter section 14 comprises selectors 40 and 44, and RL counter 42. Generation section 15 is constituted by a circuit shown in FIG. 3 excluding counter section 14.

Decoding result I from decoder ROM 32 is input to selector 40. Selector 40 also receives data L from controller 1. These data are selected in response to a control signal from controller 1, and are output to RL counter 42. Of the output data from selector 40, a 02-00-bit portion is also output to selector 44. RL counter 42 is a counter having a 12-bit length, and latches data from selector 40 at a predetermined position in accordance with a control signal from controller 1. RL counter 42 counts down in accordance with count pulses from controller 1, using the output data from selector 40 as a preset value, and outputs the count to selector 44 and albl detector 16 as data B.

The output from RL counter 40 is also output to controller 1 as data M in order to certify if the number of processing operations determined by the decoded code is completed. Selector 44 receives the output from counter 42, the output from selector 40, and data A from albl detector 16, and selects one of them in response to a control signal from controller 1 to output the selected data to encoder ROM 46.

Encoder ROM 46 receives data N, including data for color designation and data indicating expansion or compression processing, from controller 1. Encoder ROM 46 receives the data from selector 44 and data N from controller 1 as address data, and outputs 8-bit data EROM07-00 to selector 48.

Of data EROM07-00, data DROM07-05 is output to adder 52. A circuit constituted by adder 52, selector 54, and image pointer 56 is operated in the same manner as the circuits of decoding section 8. More specifically, image pointer 56 generates an indication value. After the completion of generation processing for the decoded code, the indication value from image pointer 56 is added to data EROM07-05 by adder 52, and the summed data is output to selector 54.

Data C is input to selector 54 from albl detector 16, and is selected in response to a control signal from controller 1 to serve as an indication value of image pointer 56. When $2^3$-bit data is "1" as a result of addition of adder 52, this is signaled to controller 1 by means of data 0.

Selector 48 receives data EROM07-00 and data G from decoding processing section 7 via latch 58, and selects one of them in response to the control signal from controller 1 to output the selected data to barrel shifter 50. Barrel shifter 50 rotates the input data in accordance with the indication value from image pointer 56 and outputs the rotated data to selector 60. At the same time, shifter 50 outputs the rotated data to register 62 as data RODT15-08.

Data RODT07-00 and data RODT15-08 are selected by selector 64 in accordance with a control signal from controller 1, and the selection result is input to selector 60. An output from selector 60 is supplied to register 62 as data RODT07-00. Register 62 shifts data RODT15-08 to data RODT07-00 in accordance with a control signal from controller 1. Data RODT07-00 and data RODT15-08 are output to selector 64.

Furthermore, data RODT07-00 is output to reference line data storage section 4 as data P, when image data for one byte is generated, and is also output to inverter 66, similar to inverter 24, to be finally output onto an output data bus.

Figure 4:
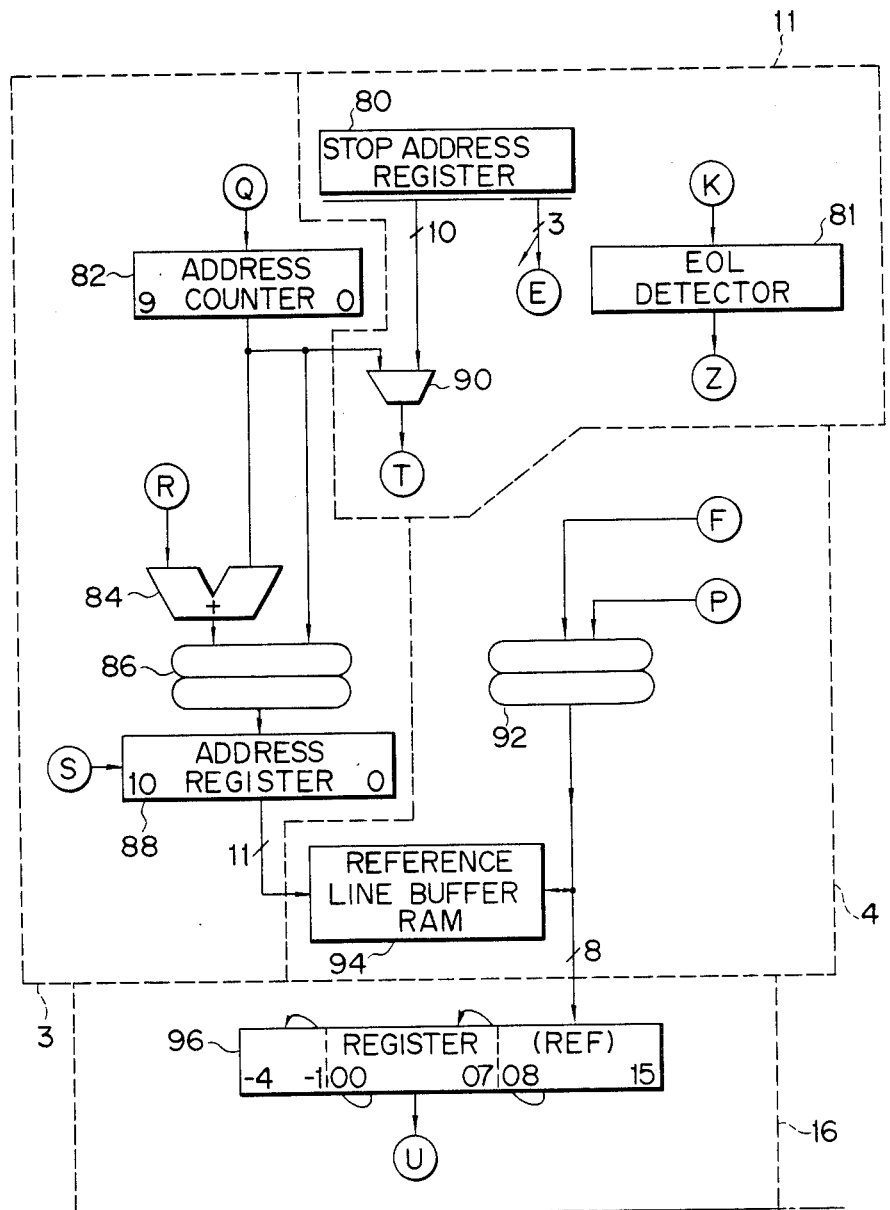
FIG. 4 is a block diagram showing the arrangement of a reference line address generator and an EOL detector of the decoding processing section shown in FIG. 1.

The arrangement of reference line address generator 3, EOL detector 11 of decoding processing section 7, and reference line data storage section 4 will be described with reference to FIG. 4.

EOL detector 11 of decoding processing section 7 comprises stop address register 80, comparator 90, and EOL detector 81. Reference line address generator 3 comprises address counter 82, adder 84, selector 86, and address register 88. Reference line data storage section 4 comprises selector 92 and reference line buffer RAM 94.

Stop address register 80 latches, in advance, one-line run length data, and outputs upper 10-bit data to comparator 90. Address counter 82 receives data Q from controller 1. Data Q is input to counter 82 each time one-byte binary data processing is completed, and counter 82 accumulates data Q until the one-line processing is completed. Therefore, an output from address counter 82 indicates the byte position to which binary data processing has progressed on the corresponding processing line.

Address counter 82 is reset in response to a control signal from controller 1 upon completion of one-line processing, and restarts counting when a new line's processing is started. A count value of address counter 82 is output to comparator 90, selector 86, and adder 84. Comparator 90 also receives run length data for one line from stop address register 80 in units of bytes, and compares it with the count value of address counter 82. When a coincidence is found therebetween, this means that image generation has reached a byte position before the end of the corresponding processing line. At this time, data T is output to controller 1.

Adder 84 receives data R from controller 1, and adds it to the count value from address counter 82 to output the sum to selector 86. Selector 86 selects address data from address counter 82 and address data from adder 84 in response to a control signal from controller 1, and outputs the selection result to address register 88.

Address register 88 also receives data S from controller 1, and outputs it to reference line buffer RAM 94 together with the output from selector 86.

Reference line buffer RAM 94 stores image data on a reference line, and image data on the corresponding processing line for processing of the next line. Therefore, image data for two lines are stored in RAM 94, and data S is supplied to address register 88 from controller 1 in order to switch designation memory areas, i.e., to determine which area is to be selected.

Selector 92 receives input byte image data F, i.e., data RIDT07-00 via encoding end processing section 28, and byte data P, i.e., processed image data RODT07-00, and selects one of them in response to a control signal from controller 1, thereby storing the selection result in reference line buffer RAM 94.

As is clearly understood from the above description, upon readout of reference line data, selector 86 selects the output data from adder 84, and upon storage of reference line data, selects the output data from address counter 82 to output it.

At the beginning of processing for a new line, when reference line data is read out, "2" and "1" are input to adder 84 as data R from controller 1 in order to output reference data necessary for register 96. Then, register 96 can hold necessary reference line data. Data REF-3-10 from register 96 is output to b1 detector 102 as data U.

EOL detector 81 detects an EOL code when an error occurs in, e.g., detector processing section 7 or generation processing section 8. Detector 81 receives data K from decoding processing section 7, and signals detection of an EOL code to controller 1 by means of data Z.

The arrangement of a1b1 detector 16 of generation processing section 8 will now be described with reference to FIG. 5. a1b1 detector 16 is frequently used in a vertical mode and a pass mode in a two-dimensional mode.

Data read out from RAM 94 is latched by register 96 as data REF15-08. Register 96 shifts data 07-04 to data REF-4-1 and data REF15-08 to data REF07-00 in units of bytes in accordance with a control signal from controller 1, and latches data from RAM 94 as data REF15-08. Data U associated with a reference line is supplied from register 96 to b1 detector 102. Data F is supplied from encoding end processing section 28 to a1 detector 104. b1 and a1 detectors 102 and 104 receive an indication value a0 from a0 pointer 100, and respectively detect positions a1 and b1 of pixels having color changes on an encoding line and a reference line on the right side of position a0 on register 96.

Position b1 detected by b1 detector 102 is output to subtractor 120 and selector 108. When b1 point is not detected, this is informed to controller 1 by data A2. "+4" is added to position b1 in association with register 96. Position a1 detected by a1 detector 104 is output to selectors 116 and 114. Selector 116 selects data from a1 detector 104 and data +4 from controller 1 in accordance with a control signal from controller 1, and outputs the selection result to subtractor 120.

Subtractor 120 outputs the calculation result to generation section 15 as data A. Selector 108 receives the indication value from a0 pointer 100 and an output b1 from b1 detector 102, and selector 110 receives value −4 from controller 1 and date B from generation section 15. Selectors 108 and 110 select the respective outputs in response to control signal from controller 1, and output them to adder 112.

Adder 112 outputs the sum to selector 114. Selector 114 also receives output a1 from a1 detector 104, the indication value from a0 pointer 100, and data W from controller 1, and selects an output in response to a control signal from controller 1. The selected output is supplied to generation section 15 as data C, and is also supplied to decoding section 13 as data D. The output from selector 114 is also latched by a0 pointer 100 as an indication value. The indication value of a0 pointer 100 and data from stop address register 80 are compared by comparator 106 to detect that the processing of last data less than one byte is completed, and the comparison result is output to controller 1 as data V.

The operation of the binary data compression and expansion processing apparatus of the present invention will now be described.

First, expansion processing will be described in detail.

When expansion processing of a new page is started, control data including data for determining the MH, MR, or M²R method is supplied in the case of a facsimile system. The control data includes data indicating a run length for one line. Stop address register 80 stores the run length data for one line. In processing by the M²R method, all the bits of image data on the reference line at the beginning of a page are white or "0". In this state, an EOL code is first detected by EOL detector 81 to start expansion processing.

When expansion processing for a new line is started, a necessary condition is initialized. For example, the following initialization is performed. Address counter 82 is reset, and data S is supplied to bit "10" of address register 88 from controller 1 in order to switch addresses. Thereafter, "1" is input to adder 84 as data R from controller 1, and first byte data on the reference line is read out from reference line buffer RAM 94 to be stored in register 96 as data REF15-08. After the data stored in register 96 is shifted to data REF07-00, "2" is then supplied from controller 1 as data R, and byte data read out from RAM 94 is stored in register 96 as data REF15-08 in the same manner as described above. Pointers 36, 56, and 100 are reset. Data W is input to selector 114 from controller 1, and is selected in accordance with a control signal from controller 1, so that a new value is set in a0 pointer 100. The color is forcibly set to be white.

For example, assume that a code encoded by the M²R method is input to decoding processing section 7 via a input data bus in units of 8 bits, i.e., 1 byte, after the aforementioned initialization is performed, and is latched by latch 22 in accordance with a control signal from controller 1.

In a register for mainly holding image data and a compressed code, a leftmost bit is bit "0". Meanwhile, in a register for mainly holding binary control data, a rightmost bit is bit "0". Therefore, the input binary data must be inverted. The input binary data is thus inverted by inverter 24, and is then output to register 26 and EOL detector 11. In register 26, previously input byte data RDTI15-08 is shifted to data RDTI07-00 in accordance with a control signal from controller 1, and new input data is latched as data RDTI15-08 and is held as 16-bit data together with data RDTI07-00. In this manner, at the beginning of a page, 2-byte binary data is input.

16-bit register data RDTI15-00 is output to encoding end processing section 28. This circuit is operated only in compression processing, and simply allows data to pass therethrough in expansion processing. Therefore, 16-bit register data RDTI15-00 is output to funnel shifter 30 via processing section 28.

Decoding pointer 36 indicates the LSB position of a code, to be extracted next, from register data RDTI15-00 input to funnel shifter 30. Funnel shifter 30 generates 9-bit output LSHT08-00 obtained by left-shifting data RDTI15-00 by the number of bits indicated by an indication value from pointer 36. For example, if the value of pointer 36 is "3", funnel shifter 30 selects data RDTI11-03 from input data RDTI15-00, and outputs it as data LSHT08-00.

Data LSHT08-00 is added to data corresponding to data LSHT10-09 from controller 1, and the result is output to selector 31. Selector 31 also receives data corresponding to data LSHT06-08 or LSHT07-08 from controller 1. These input data are selected in accordance with a control signal from controller 1, and the selected data is output to decoder ROM 32 as 11-bit address data.

In this case, with the M²R method, if generation processing of an immediately preceding decoded code is not completed, the control signal associated with selector 31 is not generated. Therefore, selector 31 awaits the completion of generation processing in a state that the data LSHT08-00 is supplied.

If selector 31 does not await the completion, a white run cannot be forcibly set for a beginning code of the next line after processing progresses up to the end of the current processing line. In this case, if decoding for the beginning code is performed, the value of decoding pointer 36 must be reset and decoding must be restarted, resulting in inconvenience.

However, if such advanced processing is not performed, an EOFB code (End of Facsimile Block: the EOFB code has double EOL codes) at the end of a page cannot be decoded and processing is stopped at the EOFB code. Therefore, when an EOL code in the EOFB code is detected by EOL detector 81, decoding is performed by advanced processing in the present invention.

Since the MH and MR methods use an EOL code unlike the M²R method, a code data can be decoded by advanced processing without waiting completion of current generation processing. Thus, decoding processing of the M²R method, even that of the MH and MR methods can be performed at higher speed than a conventional apparatus.

Data LSHT10-00 is output to decoder ROM 32 in response to a control signal from controller 1. If data Y08-06 is selected, the 08-06-bit portion or the 08-07-bit portion of data LSHT10-00 is selected as the corresponding portion of data LSHT, and the data LSHT08-00 portion is shifted toward the MSB direction by corresponding bits to be output to decoder ROM 32.

An address format of decoder ROM 32 (to be described later) reveals when and which data is to be selected. Decoder ROM 32 outputs 16-bit data DROM15-00 having a format shown in FIG. 9A in accordance with an address data format shown in FIG. 8. More specifically, run length data is output as data DROM07-00, code length data is output as data DROM11-08, and data for designating the next state is output as data DROM15-12. The address and output formats will be described later in detail.

Data DROM11-08 is output to adder 34. At the same time, adder 34 receives data from pointer 36. Thus, data DROM11-08 is added to the content of pointer 36, and the summed data is output to selector 38. Selector 38 receives signal D, which is used in compression processing and is not used in expansion processing, from albl detector 16. However, since expansion processing is executed in this case, the output from adder 34 is selected in response to a control signal from controller 1. Therefore, the summed data again becomes the content of pointer 36. Pointer 36 indicates the LSB position of a code next to a decoded code in this manner.

When $2^3$-bit data becomes "1" as a result of addition of adder 34, this is signaled to controller 1 by means of data J. This means that decoding processing for one byte is completed. Therefore, controller 1 outputs a control signal to register 26, to left-shift data RDTI15-08 to data RDTI07-00 in units of byte. New byte data latched by latch 22 is latched as data RDTI15-08 in register 26 in accordance with a control signal from controller 1. Pointer 36 receives lower 3 bits of the summed data from adder 34, so that the LSB position of a code to be decoded is always present in data RDTI07-00 of register 26.

The address and output formats of decoder ROM 32 will now be described with reference to FIGS. 8, 9A, and 9B. Here, a code unit to be decoded is an identification code of a horizontal mode, a make-up code, a terminating code, a vertical mode code, a pass mode code, an extension code, or etc. If the make-up code or a terminating code exceeds nine bits, two decoding processings are executed.

An address of decoder ROM 32 has an 11-bit configuration. ROM 32 includes white run one-dimensional code table 1, black run one-dimensional code table 2, black run one-dimensional code table 1, two-dimensional code table, special code detection table, uncompressed code table 1, uncompressed code table 2, table for processing in other bit units, which are prepared for expansion processing, and table for compression processing.

Almost all white run one-dimensional codes consist of 9 bits or less. Only a make-up code when a run length exceeds 1792 bits or more consists of 10 bits or more and the make-up code is identical with that for a black run having the same run length. Therefore, a white run one-dimensional code of 9 bit or less is processed by white run one-dimensional code table 1. If a code consists of 10 bits or more, black run one-dimensional code table 2 is used successive to white run one-dimensional code table 1.

Code "00" is supplied from controller 1 as data LSHT10-09 of white run one-dimensional code table 1. Almost all black run one-dimensional codes consist of 10 bits or more, and a maximum length is 13 bits. A black run make-up code having a run length of 1792 bits or more is common to that for a white run. Thus, if a black run code consists of 7 bits or less, it is processed using black run one-dimensional code table 1, and if it consists of 8 bits or more, 2-step decoding processing is performed using black run one-dimensional code table 2 successive to black run one-dimensional code table 1.

Code "10" is supplied from controller 1 as data LSHT10-09 of black run one-dimensional code table 1, and code "00" is supplied as data LSHT08-07. Code "01" is supplied from controller 1 as data LSHT10-09 of black run one-dimensional code table 2. An MH code portion of a code in the horizontal mode encoded by the MR or M$^2$R method is processed using the one-dimensional code tables.

Therefore, codes of a pass mode and a vertical mode, and an identification code in a horizontal mode are processed using the two-dimensional code table. Code "1001" is supplied from controller 1 as data LSHT10-07.

The special code detection table is used for detecting an EOL or EOFB code and for detecting an extension code for entering the uncompressed mode. For this purpose, a 6-bit code is fetched. Code "10110" is supplied from controller 1 as data LSHT10-06. For the uncompressed mode, uncompressed code tables 1 and 2 are provided. Codes "10100" and "10101" are supplied from controller 1 as data LSHT10-06 of these tables, respectively. Control code "10111" is supplied from controller 1 as data LSHT10-06 for the other table.

The output format of decoder ROM 32 is as shown in FIG. 9A. The 07-00-bit portion of data DROM15-00 represents run length data of a decoded code. The 11-08-bit portion of data DROM15-00 represents code length data of a decoded code in units of bits. The 15-12-bit portion of data DROM15-00 represents next state data, used for control, including data for designating the table to be referred to next, thereby, a color for the next code is designated. This data signals to controller 1 the classification of the decoding result, e.g., that a decoded code is a terminating code in the horizontal mode, a make-up code in the horizontal mode, the vertical mode, the pass mode, or the uncompressed mode the extension code, or etc.

The output format of data DROM07-00 is as shown in FIG. 9B. More specifically, in a one-dimensional coding make-up code, 6 bits of data DROM05-00 indicate a 64× value obtained by decrementing a practical run length by "b 1". In a one-dimensional coding terminating code, 6 bits of data DROM05-00 indicate a bit value obtained by decrementing a practical run length by "1". In a two-dimensional coding vertical mode, 4 bits of data DROM03-00 indicate the state of the run length, i.e., a value obtained by subtracting "4" from a difference between a1 and b1. In a two-dimensional coding pass mode, 4 bits of data DROM03-00 indicate "1100".

Furthermore, in the uncompressed mode, data DROM02-00 indicates a pattern length. Therefore, if terminating code (000111) is input on the right side from a point designated by pointer 36 in data held by register 26, data indicating "it is a terminating code having a white run length of 1" is output in a 07-00-bit portion and data indicating "the length of this code is 6 bits" is output in a 11-08-bit portion from decoder ROM 32, accessed by 9 bits starting with this bit pattern, i.e., "000111xxx" (x is "0" or "1").

More specifically, the run length data "01000000" is output as data DROM07-00, and the code length data "0110" is output as data DROM11-08.

A state transition sequence indicating how decoding section 13 refers to the tables in expansion processing will be described with reference to FIG. 6.

Decoding section 13 in this embodiment decodes codes for one line under the control of controller 1. With reference to FIG. 6, control signal 1D indicates whether a line to be decoded is a line encoded by the MH method. Control signal 1D is supplied from controller 1 for each line. For example, when the apparatus is operated in the MH mode, control signal 1D becomes "1" for all the lines, and becomes "0" in modes other than the MH mode. Other transition conditions are determined depending on the output from decoder ROM 32, i.e., the next state data.

Figure 6:
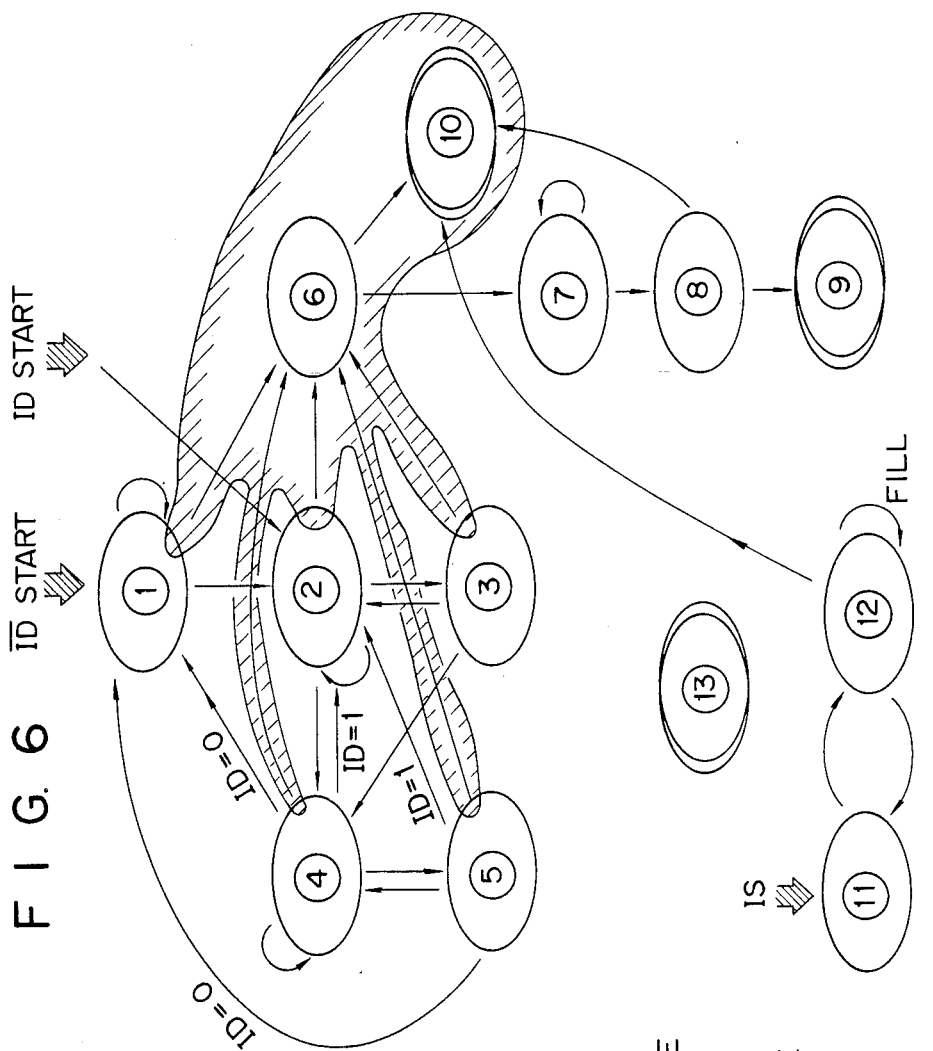
FIG. 6 is a diagram showing a decoding sequence of the decoding processing section shown in FIG. 2.

In FIG. 6, ellipses representing various states indicate which table is referred from the plurality of tables stored in decoder ROM 32. Since one-dimensional coding is divided into white and black runs, different one-dimensional code tables A and B are referred in accordance with the white and black runs.

In this embodiment, decoding section 13 can process a code of up to 9 bits in one cycle. Since codes of 10 bits or more are present in the one-dimensional codes, they are processed in two cycles. For this purpose, one-dimensional code tables 1 and 2 are prepared and the table 2 is included in black run one-dimensional code table 2, as second stage code tables of one-dimensional codes. Two one-dimensional code tables A and B are used for each of stages 1 and 2 to distinguish two runs, i.e., white and black runs in horizontal mode codes.

One-dimensional code tables A and B can be used for either color of runs. If one-dimensional code table A is used for white runs, one-dimensional code table B is used for black runs. The following description will be made such that one-dimensional code table A is for white runs. Therefore, table 1A corresponds to white run one-dimensional code table 1, table 1B to black run one-dimensional code table 1, and tables 2A and 2B to black run one-dimensional code table 2.

The special code detection table is separately prepared for decoding an EOL code and extension codes (among these, ones specified by the CCITT recommendation are an identification code of an uncompressed mode). In the EOL and extension codes, "0"s succeed for 6 bits or more.

A case will be described wherein a one-dimensional coding mode line encoded by the MH method is decoded. When a one-dimensional coding mode line is decoded, since control signal 1D is "1", one-dimensional code table 1A is first used to decode a code. If the code consists of 9 bits or less, decoding can be completed only by one-dimensional code table 1A. However, if the code consists of 10 bits or more, one-dimensional code table 2A is subsequently used. A white run one-dimensional code, even a make-up code or a terminating code, consists of 9 bits or less unless it is a make-up code having a run length of 1792 bits or more. Therefore, for a white run, if codes of a maximum of 9 bits are decoded in one cycle as in this embodiment, only one-dimensional code table 1A is used. For a make-up code having a run length of 1792 bits or more, after one-dimensional code table 1A is referred, decoder RAM 32 is controlled by data X and Y from controller 1 based on the data DROM 15-12 at a first cycle, to refer to one-dimensional code table 2A.

In a one-dimensional code, a white run is always followed by a black run and vice versa unless it is the end of a line. After the end of the line, the white run is forcibly set. Therefore, when decoding of a terminating code is completed using one-dimensional code table 1A or 2A, the next one-dimensional code is decoded using one-dimensional code table 1B.

Almost all the black run codes, even make-up and terminating codes, consist of 9 bits or more. Therefore, when a black run code is decoded in practice, one-dimensional code table 1B is referred to, and then, one-dimensional code table 2B is referred to in response to data X and Y from controller 1 according to the output of the decoding result. When decoding of a terminating code is completed using one-dimensional 1B or 2B, the color designation of a run is updated to change data X, and then one-dimensional code table 1A is used.

In this manner, one-dimensional code tables A and B are alternately used to perform decoding for one line. When decoding progresses to the end of the line, if "0"s succeed for 8 bits or more from the beginning of a code in one-dimensional code tables 1 and 2, the special code detection table is used to detect an EOL code, thus performing EOL detection processing.

Decoding of codes encoded by the MR or $M^2R$ method will now be described. For codes encoded by the MR and $M^2R$ methods, control signal 1D is "0" and signal 1D is "1". Therefore, decoding section 13 first refers to the two-dimensional code table. Among two-dimensional codes, since codes in the vertical and pass modes and an identification code of a horizontal mode consist of 6 bits or less, it is processed in accordance with the two-dimensional code table, and the next code is also processed in accordance with the two-dimensional code table in response to data X and Y from controller 1.

When the identification of the horizontal mode code is decoded by the two-dimensional code table, for the subsequent code, one-dimensional code table 1A is referred to in the same manner as in the code encoded by the MH method. The same table transition applies to this. At this time, one-dimensional code table A is referred to for the first color, e.g., for the white run. When decoding of a terminating code is completed, one-dimensional code table B is referred to in order to decode a black run code.

When decoding of the terminating code is completed using one-dimensional code table 1B or 2B, the two-dimensional code table is again referred to in response to data X and Y from controller 1 in accordance with the output of the decoding result.

When "0"s succeed for 6 bits or more from the beginning of a decoded code in two-dimensional table, and when "0"s succeed for 8 bits or more in one-dimensional code tables, the special code detection table is used to detect an EOL code, thus performing EOL or EOFB detection processing.

The uncompressed mode will now be described. When the special code detection table is referred to, if it is detected that a code is not an EOL code, i.e., it is an identification code of an uncompressed mode, controller 1 transfers the state to uncompressed code table 1. This code is decoded using uncompressed code table 1.

In the uncompressed mode, if five "0"s succeed, "1" is inserted. Therefore, six "0"s will not succeed except for an identification code for returning to a normal code.

If "0"s succeed for 6 bits or more, uncompressed code table 2 is referred to to check if it is an end code of the uncompressed mode. If the end code is detected, decoding processing returns to a normal coding mode, i.e., to the two-dimensional code table or one-dimensional code table 1A or 1B.

When the EOL code is detected, post-processing is performed in the same manner as described above.

Decoding of an EOL code will now be described. In the MH or MR method, an EOL code is used. However, in the $M^2R$ method, no EOL code is used as described above. Instead, an EOFB (End Of Facsimile Block) code having two succeeding EOL codes is used. When the one-dimensional code table is referred to, "0"s will not succeed for 8 bits or more except for the EOL code and an extension mode, unless a coding error occurs. At this time, the EOL code is detected by referring to the special code detection table in response to data X and Y from controller 1.

In the MR or $M^2R$ method, "0"s will not succeed for 6 bits or more in the two-dimensional code table. When "0"s are succeeded for 6 bits or more from the beginning of a code decoded in the two-dimensional code table, the special code detection table is referred to to detect the EOL code.

In the $M^2R$ method, since reception data is transmitted together with check data, a transmission error may not occur. However, in the MH and MR methods, an error can occur. If it is detected that a decoded code includes an error, control signal 1S is executed, and the corresponding processing line is skipped through its end. Then, the EOL code is detected by EOL detector 81, and if it is certified as an EOL code, EOL detection processing is executed.

More specifically, when an error occurs, decoding of the corresponding processing line is completed upon error detection and decoding of the next processing line is started. This EOL detection section is also used for detecting a first EOL code sent at the beginning of a page.

In the $M^2R$ method, error check is performed upon transfer of data, as described above. When an error code is detected, a re-transmission request is generated, and correct data is sent. Therefore, error detection can be omitted. In the $M^2R$ method, no EOL code is used, as described above. Instead, an EOFB code is provided at the end of codes for one page.

If the state of decoding section 13 is simply not altered for advanced processing, when processing progresses to the end of the last line, the presence of the (first half of the) EOFB code cannot be checked. In order to solve this problem, when it is detected in a hatching portion of FIG. 6, i.e., during decoding a code consisting of all bits "0", and when the special code detection table must be referred to, the state of decoding section 13 can be altered for the advanced processing regardless of the aforementioned operation, in the EOL detection state. Thus, when processing progresses to the end of the last line, decoding section 13 can decode the first half of the EOFB code, and hence, can subsequently decode the second half.

In the present invention, when a code encoded by some method other than the $M^2R$ method, i.e., by the MR or MH method is decoded, the advanced processing can progress within the range of processing for one run. More specifically, when it is detected that one-dimensional code table 2 or the special code detection table is to be referred to after one-dimensional code table 1 is referred to, processing for referring to one-dimensional code table 2 or the special code detection table can be completed before generation processing for a immediately preceding decoded code is completed. This is because since these methods use EOL codes, even if the state of the decoding processing section 7 is altered for the advanced processing, no problem will be posed, i.e., the color of the beginning of the next line is determined. The thus decoded result is output to generation processing section 8.

The operation of generation processing section 8 for processing binary data based on the decoding result from decoding processing section 7 will now be described. The decoding result, i.e., run length data, is input to generation processing section 8. A case will be described when the run length data of a one-dimensional mode code is first input.

Assume that the decoding result of a make-up code is input from decoder ROM 32 to selector 40. In this case, selector 40 receives data L as the run length data from controller 1. If the output from decoder ROM 32 is selected in response to a control signal from controller 1, the output is input to RL counter 42. RL counter 42 is a counter having a 12-bit length, and stores the decoding result of the make-up code from decoder ROM 32 in 08-03 bit portion of 6 bits. Since the run length data of the make-up code output from decoder ROM 32 is a value obtained by decrementing a practical run length by "1", "1" is input to 02-00-bit portion of RL counter 42 to be "111".

This data is output to encoder ROM 46 as address data through selector 44. Encoder ROM 46 also receives data including data for color designation and data indicating either of compression and expansion processing, as data N from controller 1. In response to the address data input to encoder ROM 46, 8-bit data "00000000" or "11111111" is output from encoder ROM 46. The output data is supplied to barrel shifter 50 via selector 48.

Generation processing section 8 has the similar circuit to decoding pointer 36. Barrel shifter 50 receives indication data from image pointer 56, and rotates the input data to output the rotated data. However, since all the bits are "0" or "1", there is no difference if the data is rotated or not. At this time, since the data is output from EROM 46 in units of bytes, no data is output from encoder ROM 46 to adder 52. This is because, since the generation processing is performed in units of bytes, the indication value of image pointer 56 need not be changed.

The output from barrel shifter 50 is supplied to selector 60 and to the 15-08-bit portion of register 62. Selector 60 receives data RODT07-00 or RODT15-08 through selector 64. In this case, the run length data to be generated is of a make-up code, and data RODT15-08 is selected in selector 64 while processing of the code. Selector 60 also receives the same indication data from image pointer 56 as barrel shifter 50.

Selector 60 selects data from selector 64 from the LSB position to a bit position smaller by "1" from the indication data from image pointer 56, and selects the output from barrel shifter 50 from the indication data to the MSB position, thus outputting the selected data as data RODT07-00 of register 62.

For example, if the indication data of the pointer is "3", data from selector 64 is selected as data RODT02-00, and data from barrel shifter 50 is selected as data RODT07-03. With the above operation, since an image data pattern for one byte is generated, data RODT07-00 of register 62 is output onto an output data bus through inverter 66 similar to inverter 24, and is supplied to reference line data storage section 4 as data P to be stored therein at an address corresponding to the current value of address counter 88. Thus, a first step of generation processing is completed, which is detected by controller 1.

Upon completion of processing for one byte, one clock is applied to address counter 82 as data Q to increment it by "1". At this time, in the case of a code encoded by the $M^2R$ method, the value of counter 82 is compared with the value of stop address register 80, thus checking if the processing progresses up to the end of the line. In the case of a code encoded by the MR or MH method, there is no problem since EOL code is used.

Data in register 96 is shifted toward the LSB direction for one byte. New reference line data is read out from storage section 4 using the sum of the value of address counter 82 and data R, as an address, and is latched in register 96 as data REF15-08. At this time, a content of a0 pointer is not changed. Data M from RL counter 42 is output to controller 1. Controller 1 checks, based on data M from RL counter 42, if generation processing of the input make-up code is completed.

If not completed, the content of RL counter 42 is decremented by "1" and then is supplied to encoder ROM 46 through selector 44. The generation processing is repeated in the same manner as described above until the data M from RL counter 42 becomes equal to data "0". When data M is equal to data "0", the generation processing for the corresponding make-up code is a last step, and subsequently, the terminating code is processed.

When selector 40 selects data L, the same processing as that for the make-up code is also performed. When a run of the same color continues for a length 2561 or more, a code representing run length 2560 is repeated according to the run length. The repeated number and data indicating the run length (2560-64) are set in RL counter 42 as data L. When the generation processing for the run length 2560 is completed, the repeated number is decremented by "1", and the generation processing is performed again. Thus, all the generation processing is repeated until data M is equal to "0".

A case will be described wherein the decoding result of a terminating code is processed. The decoding result or run length data is input as data I to the 05-00 portion of RL counter 42 through selector 40. The 05-03 portion of RL counter 42 is processed in units of bytes in the same manner as that of the make-up code.

The content of 05-03 bit portion is decremented by "1" each time the generation processing of a byte of image data is completed. After completion of the processing of byte data, data 02-00 smaller than one byte is processed.

Data 02-00 is input to selector 44, and is selected thereby to be input to encoder ROM 46 in the same manner as that of the make-up code. The image data pattern generated by encoder ROM 46 is shifted by barrel shifter 50, and is then output to a data RODT15-08 portion of register 62 and selector 60.

Thereafter, the image data pattern is synthesized with the previously processed data RODT15-08 by selector 60 in accordance with the indication data of image pointer 56, and the synthesized data is input to the data RODT07-00 portion of register 62. At this time, data corresponding to the length of the output image pattern data is output from encoder ROM 46 to adder 52 as EROM07-05. As a result, the value of image pointer 56 is updated. At this time, when $2^3$ bits become "1" in the output of adder 52, this is signaled to controller 1 as data 0 to inform that processing for one byte is completed. When data 0 is output, register 62 outputs data RODT07-00 onto a data bus via inverter 66 in response to a control signal from controller 1 and stores it in storage section 4 as data P. If $2^3$ bit is not "1", data RODT07-00 is held until the next image data pattern is generated.

When the next image data pattern is input to selector 60, data RODT07-00 of register 62 is supplied to selector 60 through selector 64. In this manner, the same operation is repeated.

When a terminating code of less than one byte is to be processed, substantially the same processing as that for the data of less than one byte is performed except that the decoding result is supplied directly to selector 44 without going through RL counter 42. The above operation can be attained for an MH code portion of a horizontal mode code encoded by the MH method and those encoded by he MR and M$^2$R methods.

Next, generation processing for a code in the pass mode and the vertical mode as the two-dimensional coding mode will now be described. When a color change bit position b1 is not detected on the reference line data in register 96, this is informed to controller 1 as data A2, and one byte of image data pattern is generated from encoder ROM 46 in accordance with data N from controller 1. The generation processing of the image data pattern is performed in the same manner as in the make-up code of a horizontal mode. The indication data of image pointer 54 is unchanged.

In the case that b1 is detected by b1 detector 102 of a1b1 detector 16, b1 is supplied to selector 108. Since value b1 is counted from a −4-bit position as can be seen from register 96, "+4" is added to it. The run length data in the pass mode or the vertical mode is latched in RL counter 42, and the image data is generated in the same manner as described above. The run length data is output to selector 110 as data B. These data input to selector 108 and 110 are input to adder 112 and are added. When the added data is 8 or more, lower 3-bit data is selected. The lower 3-bit data of the added data is output to selector 54 as data C after the generation processing of the corresponding image data pattern is completed. The lower 3-bit data also output to a0 pointer 100.

A case will be described wherein an uncompressed mode code is input. The uncompressed mode code is input as data G to selector 48 through register 58. The following processing is performed in the same manner as described above. The run length data of the uncompressed mode code is output to RL counter 42, and processed the same manner as that of the vertical and pass node codes.

Compression processing will now be described with reference to FIG. 7.

First, compression processing for an MH code will be described. Image pattern data is input to latch 22 from an input data bus and is latched thereby. The input image data is input to register 26 through inverter 24. At this time, register data RDTI07-00 is output to reference line storage section 4 as reference line data for the next processing line, and is stored therein in accordance with data from address register 88. Also, a1 detector 104, and data 320(2560÷8) is preset in RL counter 42. a1 point detected by a1 detector 104 is output as data D to selector 38 via selector 114.

Thereafter, 9 bits are selected by funnel shifter 30 in accordance with indication data of decoding pointer 36 in the same manner as in the expansion processing, and are output to selector 31. The output from funnel shifter 30 is selected by selector 31, and is output to decoder ROM 32. When a run with the same color for more than one byte length continues, "1000", i.e., data indicating a length of one byte, is output from decoder ROM 32 as data DROM11-08 to adder 34, and data J is then output to controller 1 as the result.

The value of decoding pointer 36 is not updated. Controller 1 outputs data Q to address counter 82 in the same manner as in expansion processing to update address data. Also, the content of RL counter 42 is count down. At the same time, the contents of register 96 is left-shifted by one byte in the same manner as in expansion processing. New reference line data is read out from storage section 4, is output to register 96 and, is latched as REF 15-08. The value of pointer 100 is not changed.

Figure 7:
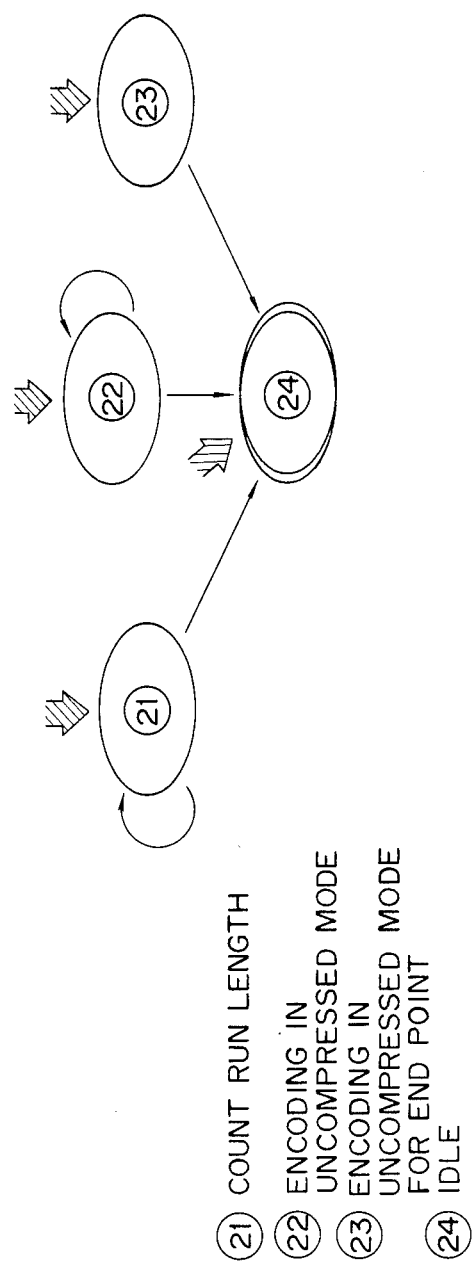
FIG. 7 is a diagram showing a generation sequence of the decoding processing section shown in FIG. 2.

In the one-dimensional mode in which the same color continues from the beginning of a run, a count pulse is input to RL counter 42 from controller 1 in accordance with data DROM 15-12 from decoder ROM 32, upon completion of processing for one byte, thereby counting down RL counter 42 as shown in ②1 of FIG. 7. When a color change point a1 is detected by a1 detector 104, i.e., when the content of data LSHT08-00 is not "00000000x" or "11111111x", the count result of RL counter 42 is supplied to encoder ROM 46 via selector 44. Data N is also supplied to encoder ROM 46, thus generating a make-up code.

The generated make-up code is supplied via selector 48 to barrel shifter 50. The generated make-up code is rotated in barrel shifter 50 in accordance with the indication data of image pointer 56. The rotated code is supplied to data RODT 15-08 portion of register 62 and is also supplied to selector 60. In selector 60, the rotated code is combined with an output of selector 64 in the same manner as in the expansion processing, in accordance with the indication data of image pointer 56. At the same time, the length of the generated make-up code is output from encoder ROM 46 to adder 52 as data EROM07-05 to add it to the indication data. The sum is the indication data of pointer 56 again. When data 0 is output to controller 1, data RODT07-00 is output onto an output data bus.

When the length of make-up code to be generated is 6 to 10 bits, a remaining portion of the make-up code is generated from encoder ROM 46 and is processed in the same manner as described above. At this time, data RODT15-08 is selected in selector 64. After the generation processing of the make-up code is completed, 11-03-bit portion of RL counter 42 is cleared and the 02-00-bit portion is shifted to the 05-03-bit portion, and remaining data smaller than one byte is input to the 02-00-bit portion of RL counter 42. This result is also output to encoder ROM 46 and is processed in the same manner as in the make-up code, to output a compressed terminating code. Processing for the length of a code is the same as that for the make-up code. In this manner, the make-up and terminating codes in the case of compression processing of the horizontal mode are generated.

The horizontal mode codes encoded by the MR and M²R methods are processed in the same manner as compression processing of the MH code, except that the identification code of the horizontal mode is added before the first make-up code in accordance with data N from controller 1.

The compression processing of two-dimensional codes in the vertical and pass modes will be described. When a1 is not detected in data RDTI07-00 as data F and b1 is also not detected in data REF-3-10 from register 96, a skip processing is performed. In the skip processing, for example, a byte of new image data pattern is input through the input data bus, and reference line data in register 96 is updated. When both a1 and b1 are detected, the compression processing of two-dimensional codes is started.

Detected a1 and b1 are supplied subtractor 120 and an output from subtractor 120 is output as data A to encoder ROM 46 via selector 44. In encoder ROM 46, the pass mode code or the vertical mode code is generated, and is processed in barrel shifter 50, selector 60, and image pointer 56, etc., in the same manner as in the horizontal mode code. At this time, b1 is selected in selector 114 and is supplied to a0 pointer 100 and decoding pointer 36 via selector 38 as data D. The following processing is the same as in expansion processing.

In the uncompressed mode, data is supplied directly to selector 48 from register 58, and is then output therefrom. The following processing is the same as in expansion processing. The code length is supplied to selector 110 as data B, and the data of image pointer 56 is updated by data B via adder 112, and selector 54.

The operation timing of decoding processing processing section 7 upon decoding of a code encoded by the M²R method will now be described in association with the operation of generation processing section 8 with reference to FIGS. 10A to 10F. In the ith step, decoding processing section 7 starts a decoding operation of an nth run, but is awaiting while leaving it uncompleted.

Conventionally, although image pattern generation may be parallel-performed in units of bytes, decoding of codes is performed in a bit serial manner.

In contrast to this, according to the present invention, since code decoding is parallel-performed as described above, most codes having a high frequency of occurrence can be decoded in one cycle.

In the case of decoding in the M²R method, since it is discriminated by the result from generation processing section 8 whether decoding is completed up to the end of a line, decoding processing section 7 does not complete the advanced processing for the next code, and interrupts processing immediately before the state is altered. If the state of decoding processing section 7 is altered for the advanced processing to, for example, advance a bit pointer, a means for returning it may be required.

When the processing in generation processing 8 is completed and a position on the corresponding processing line of the run is detected, it is checked if it coincides with the rightmost position of a line. If no coincidence is found, since normal decoding can be performed, decoding processing section 7 completes the decoding processing, sends the decoding result to generation processing section 8, and starts the processing of the next run.

Generation processing section 8 starts image pattern generation based on the run length data sent from decoding processing section 7. When a position on the corresponding processing line of the run coincides with the end of the line, after generation processing section 8 executes processing for completing current processing line, controller 1 prepares for the next processing line, e.g., switches storage areas of storage section 4 for holding reference line image data. In this case, generation processing section 8 signals the end of the line to decoding processing section 7 via controller 1.

As described above, since the beginning of the line is determined to be a white run as described above, decoding processing section 7 re-decodes the corresponding code to be white using information from generation processing 8. At this time, since decoding processing 7 has not yet completed the advanced processing and altered its state, it can obtain a new decoding result only by changing color designation. If an object of the advanced processing is a code of 10 bits or more, requiring 2-step processing, decoding processing section 7 awaits information from generation processing section 8 without completing the first step.

Decoding processing section 7 can decode a code of 9 bits or less in one step, and almost all the input codes normally consist of 9 bits or less. Thus, even if the advanced processing is interrupted without causing decoding processing section 7 to alter its state, decoding processing section 7 can immediately obtain the decoding result of the next run after generation processing section 8 completes the generation processing for of the current run. In addition, generation processing section 8 can start the processing of the corresponding run without a wait time.

The relationship between the operations of decoding processing section 7 and generation processing section 8 will now be described in detail with reference to FIGS. 10A to 10C. In the ith step, decoding processing section 7 starts the decoding operation of an nth run, but stops before completing it. Assume that generation processing section 8 performs generation processing of an (n−1)th run and completes it in one step. At this time, decoding processing section 7 completes decoding of the nth run, and hence obtains the decoding result of the nth run.

More specifically, upon completion of the generation processing of a image data pattern in generation processing section 8, the processing of decoding processing section 7 is also completed in this step. Thereafter, in (i+1)th step, decoding processing section 7 starts the decoding of a code in an (n+1)th run, and pauses in a state immediately before the decoding is completed. If the nth run decoded by decoding processing section 7 consists of a 3-byte image data pattern, generation processing section 8 cannot process the nth run in one step. Therefore, decoding processing section 7 maintains the current state even after (i+2)th step.

When generation processing section 8 completes the processing for the nth run in (i+3)th step, if the code in the (n+1)th run consists of 9 bits or less, decoding processing section 7 completes the decoding processing of the (n+1)th run, and starts the decoding of the next (n+2)th run in the (i+4)th step. Generation processing section 8 begins to generate an image data pattern of the (n+1)th run in accordance with the decoding result from decoding processing section 7. In this manner, generation processing section 8 can normally start processing without any wait time.

FIGS. 10D to 10F show a similar example, and show the operation in the case wherein a code in an (n+1)th run consists of 10 bits or more. Decoding processing section 7 starts the decoding of the (n+1)th run in (i+1)th step but pauses without completing it. As soon as generation processing section 8 completes the processing of the nth run in (i+3)th step, decoding processing section 7 completes the first stage of the decoding operation of the (n+1)th run code. Subsequently, decoding processing section 7 decodes the second stage of the (n+1)th run code.

Generation processing section 8 has not obtained a new decoding result from decoding processing section 7 in the (i+4)th step yet, and pauses to receive it. When decoding processing section 7 completes decoding of the (n+1)th run code in the (i+4)th step, generation processing section 8 executes image data pattern generation processing of the (n+1)th run in the (i+5)th step.

In this manner, for a code having 10 bits or more, generation processing section 8 experiences a wait time. However, since the generation frequency of codes having 10 bits or more is low, the wait time has almost no influence on the total performance of the apparatus.

What is claimed is:

1. A binary data compression and expansion processing apparatus which can decode code data in a pipeline manner, comprising:
    holding means for receiving the code data having a first predetermined length, and for holding the latest code data for a second predetermined length;
    block output means for receiving the held code data in said holding means, for producing a code data block from input control data and a code data portion selected in accordance with bit position data input thereto, and for outputting the produced code data block in accordance with an output instruction;
    decoding means. for generating data indicating a length of a code unit and run length data corresponding to the code unit beginning from a leading bit of the code data block in accordance with an input of the code data block; and
    bit position designation means for outputting the held bit position data to said block output means, and for updating the bit position data in accordance with the code unit length data from said decoding means.

2. The apparatus according to claim 1, wherein the code unit is one of a make-up code, a terminating code, an identification code of a horizontal mode, a vertical mode code, a pass mode code, and the EOL code, and said decoding means includes a one-dimensional code table for decoding the make-up code and the terminating code, and a two-dimensional code table for decoding the identification code of the horizontal mode, the vertical mode code, the pass mode code, and the EOL code.

3. The apparatus according to claim 1, wherein said bit position designation means comprises:
    bit position data holding means for holding the input bit position data; and
    adding means for adding the bit position data from said bit position data holding means and the code unit length data from said decoding means, and for outputting as the bit position data a part of the added result to said bit position data holding means.

4. The apparatus according to claim 3, wherein said bit position designation means further comprises means for outputting a subtracting result of data indicating the first predetermined length from the added result as the bit position data when the added result is the first predetermined length data or more, and for outputting the added result as the bit position data when the added result is under the first predetermined length data, and said holding means for receiving the next code data having the first predetermined length when the added result by said adding means is the first predetermined length data or more.

5. The apparatus according to claim 1, wherein the output instruction is input when an image generation processing for a code decoded immediately before the code corresponding to the current code unit is completed.

6. The apparatus according to claim 5, wherein the code unit encoded by M²R method is decoded next by said decoding means, said decoding means further includes means for outputting state information to decode the next code unit, and the apparatus further comprises:
    line end detecting means for detecting that the decoding processing proceeds to the line end; and
    control means for outputting the control data to said block output means in accordance with the state information, the control data being output such that the current code unit is decoded as a white color when it is detected that the decoding processing proceeds to the line end, and wherein the output instruction is input to said block output means after the control data as the white color is output when it is detected that the decoding processing proceeds to the line end.

7. The apparatus according to claim 6, wherein the output instruction is input to said block output means subsequent to decode a first EOL code.

8. The apparatus according to claim 1, wherein the code unit is one of each of a plurality of divided portions of the make-up code, each of a plurality of divided portions of the terminating code, the identification code of the horizontal mode, the vertical mode code, the pass mode code, and each of a plurality of divided portions of the EOL code.

9. The apparatus according to claim 8, wherein
    the make-up code, the terminating code, and the EOL code are divided into two portions, said decoding means includes a one-dimensional code table 1 for decoding first portions of the make-up code and the terminating code, a one-dimensional code table 2 for decoding second portions of the make-up code and the terminating code, a two-dimensional code table for decoding the identification code of the horizontal mode, the vertical mode code, and the pass mode code, and a special code table for decoding the EOL code, and
    the output instruction is input to said block output means when the image generation processing for the immediately preceding code of the code corresponding to the current code unit is completed, and is subsequenty input to said block output means when the decoded code unit is one of the first portions of the make-up code, the terminating code, and the EOL code.

10. The apparatus according to claim 9, wherein said decoding means further includes an uncompressed code table for decoding an uncompressed code, and for generating the run length data as the code unit length data, an identification code of the compressed code being decoded by the special code table, and the apparatus further includes register means for holding the uncompressed code, and said block output means further includes means for outputting the uncompressed code to said register means.

11. A binary data compression and expansion processing apparatus which can decode code data in parallel, comprising:

addressing means for generating address data from input control data and input code data including a code unit as units of codes to be decoded;

decoding means, having a plurality of code tables for decoding code units, for outputting next state data indicating a table to be referred to to decode the next code unit and run length data of the decoded code unit; and control means for outputting the control data to decode the current code unit in accordance with the next state data.

12. The apparatus according to claim 11, wherein the code unit is one of a make-up code and a terminating code, and the decoding means includes a white run one-dimensional code table for decoding a white run make-up code, and a white run terminating code, and a black run one-dimensional code table for decoding a black run make-up code, and a black run terminating code.

13. The apparatus according to claim 11, wherein the code unit is one of: each of two-divided portions of a make-up code, each of two-divided portions of a terminating code, an identification code in a horizontal mode, a vertical mode code, a pass mode code, and each of two-divided portions of an EOL code, and said decoding means includes a white run one-dimensional code table 1 for decoding first portions of the white run make-up code and the white run terminating code, a white run one-dimensional code table 2 for decoding second portions of the white run make-up code and the white run terminating code, a black run one-dimensional code table 1 for decoding first portions of the black run make-up code and the black run terminating code, a black run one-dimensional code table 2 for decoding second portions of the black run make-up code and the black run terminating code, a two-dimensional code table for decoding the identification code of the horizontal mode, the vertical mode code, the pass mode and a special code table for decoding a second portion of the EOL code.

14. The apparatus according to claim 13, wherein said control means further comprises means for outputting the control data to said addressing means such that the next code unit is decoded as a white run when decoding processing is completed up to the end of a line.

15. The apparatus according to claim 13, wherein said control means includes means for outputting the control data to said addressing means in accordance with the next state data, such that the two-dimensional code table is referred to to decode the next code unit when one of the vertical mode code, the pass mode code, and the black run terminating code is decoded, such that the white run one-dimensional code table 1 is referred to when one of the identificaiton code in the horizontal mode and the white run make-up code is decoded, such that the white run one-dimensional code table 2 is referred to when one of the first portions of the white run make-up code and the white run terminating code is decoded, such that the black run one-dimensional code table 1 is referred to when one of the white run terminating code and the black run make-up code is decoded, such that the black run one-dimensional code table 2 is referred to when one of the first portions of the black run make-up code and the black run terminating code is decoded, such that the special code table is referred to when "0" bits succeed for six bits or more in the two-dimensional code table, and when "0" bits succeed for eight bit or more in the one-dimensional code tables.

16. The apparatus according to claim 11, wherein the code unit is one of a make-up code, a terminating code, an identification code of a horizontal mode, a vertical mode code, a pass mode code, and an EOL code, and the decoding means includes a white run one-dimensional code table for decoding a black run make-up code, and a black run terminating code, a two-dimensional code table for decoding the identification code of the horizontal mode, the vertical mode code, the pass mode code, and a special code table for decoding the EOL code.

17. The apparatus according to claim 13, wherein said control means further comprises means for outputting the control data to said addressing means such that the next code unit is doceded as a white run when decoding processing is completed up to the end of a line.

18. The apparatus according to claim 17, wherein said control means includes means for outputting the control data to said addressing means in accordance with the next state data, such that the two-dimensional code table is referred to to decode the next code unit when the vertical mode code and the pass mode code is decoded as the code unit, such that the white run one-dimensional code table is referred to decode the next code unit when the identification code in the horizontal mode is decoded, such that the black run one-dimensional code table is referred to to decode the next code unit when the black run terminating code is decoded, and such that the special code table is referred to to decode the next code unit when "0" bits are successive for six bits or more in the two-dimensional code table and "0" bits are successive for eight bits or more in the white and black one-dimensional code tables.

* * * * *